United States Patent
Tiwari et al.

(10) Patent No.: US 12,537,527 B2
(45) Date of Patent: Jan. 27, 2026

(54) LEVEL SHIFTER HAVING CURRENT BOOSTING STAGES

(71) Applicant: STMicroelectronics International N.V., Geneva (CH)

(72) Inventors: Manoj Kumar Tiwari, Unnao (IN); Kailash Kumar, Jharkhand (IN)

(73) Assignee: STMicroelectronics International N.V., Geneva (CH)

( * ) Notice: Subject to any disclaimer, the term of this patent is extended or adjusted under 35 U.S.C. 154(b) by 25 days.

(21) Appl. No.: 18/627,941

(22) Filed: Apr. 5, 2024

(65) Prior Publication Data

US 2024/0364340 A1  Oct. 31, 2024

Related U.S. Application Data

(60) Provisional application No. 63/498,416, filed on Apr. 26, 2023.

(51) Int. Cl.
*H03K 19/0185* (2006.01)
(52) U.S. Cl.
CPC ............................. *H03K 19/018521* (2013.01)
(58) Field of Classification Search
CPC .............. H03K 19/018521; H03K 19/018528; H03K 19/018507; H03K 19/0185; H03K 19/0175; H03K 19/00; H03K 3/356113; H03K 3/356139; H03K 3/35613; H03K 3/356121; H03K 3/356; H03K 3/353; H03K 3/02; H03K 19/00315; H03K 3/012; H03K 19/017509; H03K 17/102; H03K 17/063; H03K 17/00; H03K 17/06; H03K 17/10

See application file for complete search history.

(56) References Cited

U.S. PATENT DOCUMENTS

| 7,199,617 | B1 | 4/2007 | Schrom et al. |
| 8,218,377 | B2 * | 7/2012 | Tandon .................. G11C 5/147 365/189.11 |
| 10,211,727 | B1 | 2/2019 | Rana |
| 11,206,023 | B1 | 12/2021 | Bogi et al. |
| 2010/0061164 | A1 | 3/2010 | Tandon et al. |

* cited by examiner

*Primary Examiner* — Diana J. Cheng
(74) *Attorney, Agent, or Firm* — Seed Intellectual Property Law Group LLP

(57) ABSTRACT

A level shifter having current boosting stages is provided. The level shifter includes a level shifting stage including a plurality of transistors and first and second nodes. The level shifting stage is configured to transfer a first signal of a first voltage domain to a second signal of a second voltage domain. A plurality of current boosting stages are associated with the transistors, respectively. A first current boosting stage provides a first boosting stage current path to support a first level shifter current path of a first transistor of the plurality of transistors in response to: a first supply voltage of the first voltage domain being greater than a second supply voltage of the second voltage domain, the first signal having a first logical state and the first node having a logical state reflecting that the first signal has a second logical state different from the first logical state.

20 Claims, 4 Drawing Sheets

LEVEL SHIFTER HAVING CURRENT BOOSTING STAGES

BACKGROUND

Technical Field

The present application is directed to a voltage level shifter and, in particular, a voltage level shifter that includes multiple current boosting stages.

Description of the Related Art

Systems and devices are increasingly designed to use different supply voltages. Voltage level shifters are used for interoperability between different systems and devices when one set of systems or devices uses a first supply voltage and another set of systems or devices uses a second supply voltage that is different from the first supply voltage. For example, a low-to-high voltage level shifter may be used to translate signals from a lower voltage domain to a higher voltage domain. Conversely, a high-to-low voltage level shifter may be used to translate signals from a higher voltage domain to a lower voltage domain.

BRIEF SUMMARY

Provided herein is a voltage level shifter. The level shifter translates voltages from a first domain to a second domain, where the first voltage domain may be higher, lower or the same as the second voltage domain. The level shifter may have transistors of the same size. The transistors may be driven by voltages that are higher than, lower than or the same as the voltages provided to the conduction terminals of the transistors. The transistors driven by the higher voltages may be deemed to be 'fully on', whereas the transistors driven by the lower voltages may be deemed to be 'weakly on' or 'partially off'.

The discrepancy between the conductivity states of the level shifter transistors results in an imbalance of currents in the level shifter and, consequently, slows or delays level shifter switching. For example, a node of the level shifter may have a 'fully on' transistor sourcing current to the node, but a 'weakly on' transistor sinking current from the node. The level shifter is equipped with current boosting stages that each operate to selectively provide a supporting current path to a respective node of the level shifter in order to balance and equalize current flowing into the node with current flowing out of the node. In particular, a current boosting stage operates to provide the current path when conditions are met. The conditions are related to the input voltage domain being greater than or less than the output voltage domain and the level shifter being amidst a state transition (e.g., the input signal has a first state, but a node of the level reflects that the input signal has a different second state).

DETAILED DESCRIPTION

Figure 1:
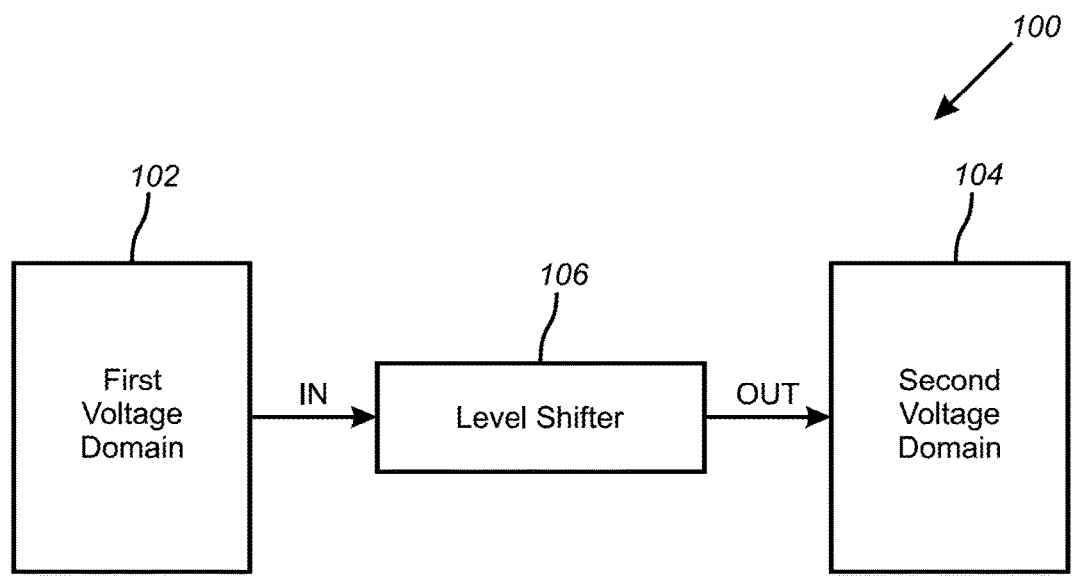
FIG. 1 shows a block diagram of a system having different voltage domains.

FIG. 1 shows a block diagram of a system 100 having different voltage domains. The voltage domains include a first voltage domain 102 and a second voltage domain 104. The system 100 includes a level shifter 106 coupled between the first and second voltage domains 102, 104. The level shifter 106 has an input coupled to an output of the first voltage domain 102. The level shifter 106 has an output coupled to an input of the second voltage domain 104.

The first voltage domain 102 may include circuits, electronic components or devices, among others, that use a first range of operational voltages. For example, the first voltage domain 102 may include one or more processors, one or more sensors or digital logic that are supplied with a first supply voltage (Vdd1) within the first range of operational voltages. Further, the signals generated by the first voltage domain 102 may have voltage levels within the first range of operational voltages. The second voltage domain 104 may include circuits, electronic components or devices, among others, that are supplied with a second supply voltage (Vdd2) within a second range of operational voltages that is different from the first range of operational voltages. The first supply voltage (Vdd1) may be lower than the second supply voltage (Vdd2), higher than the second supply voltage (Vdd2) or the same as the second supply voltage (Vdd2).

The level shifter 106 may be any circuit operative to translate, transfer or transition signals or logic states from the first voltage domain 102 to the second voltage domain 104. The level shifter 106 may be characterized as a low-to-high level shifter, a high-to-low level shifter or a bi-directional level shifter that is usable irrespective of the relationship between the first supply voltage (Vdd1) and the second supply voltage (Vdd2).

The level shifter 106 receives a first signal (IN) from the first voltage domain 102. The first signal (IN) may have a logical state (e.g., logical zero or logical one) that is set in accordance with the first range of operational voltages. The level shifter 106 outputs a second signal (OUT) that has the same logical state set in accordance with the second range of operational voltages of the second voltage domain 104. For example, the first range of operational voltages may be between 0.40 and 1.05 volts (V), whereas the second range of operational voltages may be between 1.58V and 3.60V. Continuing with the example, the level shifter 106 may translate the first signal (IN) having a voltage of 0.40V into the second signal (OUT) having a voltage of 3.60V, among other translations.

The level shifter 106 may include an input stage and an output stage. The input stage may buffer and invert the first signal (IN), and the output stage may buffer and invert a node voltage of the level shifter 106 as described herein to produce the second signal (OUT).

Figures 2A, 2B:
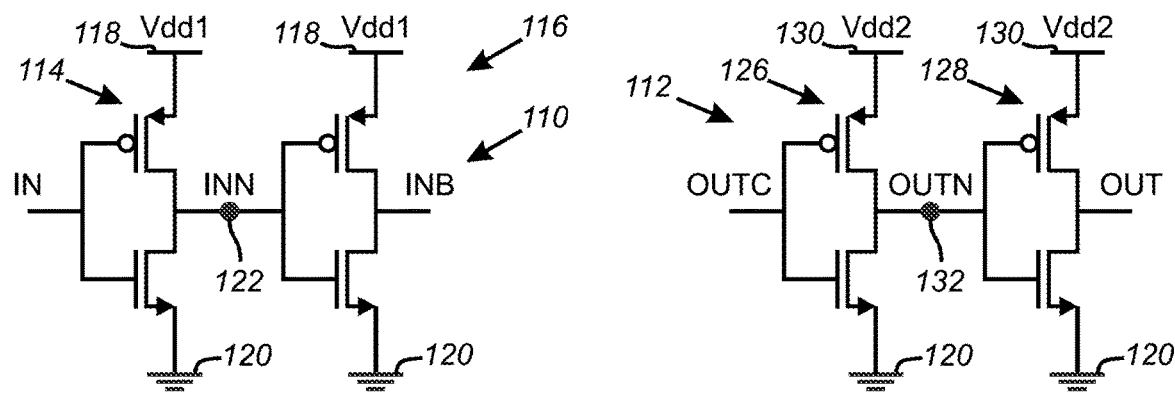
FIG. 2A shows an input stage of a level shifter.
FIG. 2B shows an output stage of the level shifter.

FIG. 2A shows an input stage 110 of the level shifter 106, and FIG. 2B shows an output stage 112 of the level shifter 106. The input stage 110 includes first and second inverters 114, 116. Each of the first and second inverters 114, 116 includes two stacked transistors. The stacked transistors of each inverter 114, 116, as a pair, are coupled between a first domain supply voltage node 118 and a reference voltage node 120. The first domain supply voltage node 118 supplies the first supply voltage (Vdd1) of the first domain. The first inverter 114 has an input configured to receive the first signal (IN) and an output coupled to an input inversion node 122, and the second inverter 116 has an input coupled to the input inversion node 122 and an output.

The output stage 112 includes first and second inverters 126, 128. Each of the first and second inverters 126, 128 includes two stacked transistors. The stacked transistors of each inverter 126, 128, as a pair, are coupled between a second domain supply voltage node 130 and a reference voltage node 120. The second domain supply voltage node 130 supplies the second supply voltage (Vdd2) of the second domain.

The first inverter 126 is configured to receive a voltage (OUTC) of a level shifter node (e.g., output node 154) and an output coupled to an output inversion node 132, and the second inverter 128 has an input coupled to the output inversion node 132 and an output configured to provide the second signal (OUT).

The input stage 110 receives the first signal (IN), inverts the first signal (IN) and outputs an inverted first signal (INN) over the input inversion node 122. The input stage 110 also inverts the inverted first signal (INN) and outputs a buffered first signal (INB) over its output. The output stage 112 receives the voltage (OUTC) of the level shifter node and outputs an inverted second signal (OUTN) over the output inversion node 132. The output stage 112 inverts the inverted second signal (OUTN) and outputs the second signal (OUT).

Figure 3:
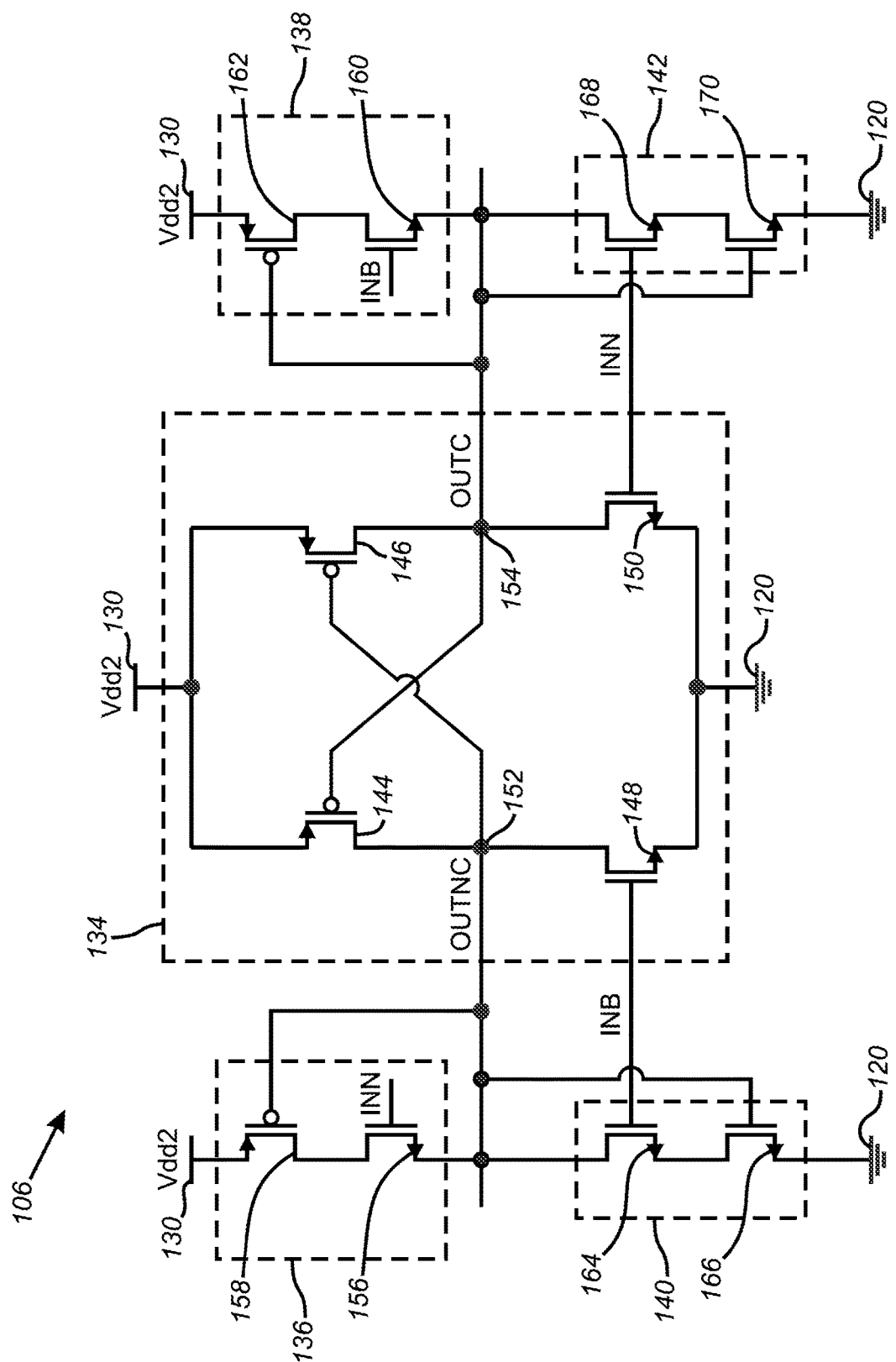
FIG. 3 shows a level shifter in accordance with an embodiment.

FIG. 3 shows a level shifter 106 in accordance with an embodiment. The level shifter 106 includes a level shifting stage 134 and four current boosting stages; first and second high-to-low current boosting stages 136, 138 and first and second low-to-high current boosting stages 140, 142. It is noted that although the level shifting stage is shown as a half-latch circuit, any other type of level shifting circuit may be used for the level shifting stage. The level shifting stage 134 includes first and second cross-coupled transistors 144, 146, first and second input transistors 148, 150, a complementary output node 152 and an output node 154. Each current boosting stage 136, 138, 140, 142 includes a respective first transistor 156, 160, 164, 168 and a respective second transistor 158, 162, 166, 170.

In the level shifting stage 134, the first cross-coupled transistor 144 has a first conduction terminal coupled to the second domain supply voltage node 130, a second conduction terminal coupled to the complementary output node 152 and a control terminal coupled to the output node 154. The second cross-coupled transistor 124 has a first conduction terminal coupled to the second domain supply voltage node 130, a second conduction terminal coupled to the output node 154 and a control terminal coupled to the complementary output node 152. The first input transistor 148 has a first conduction terminal coupled to the complementary output node 152, a second conduction terminal coupled to the reference voltage node 120 and a control terminal configured to receive the buffered first signal (INB). The second input transistor 150 has a first conduction terminal coupled to the output node 154, a second conduction terminal coupled to the reference voltage node 120 and a control terminal configured to receive the inverted first signal (INN).

In the first high-to-low current boosting stage 136, the first transistor 156 has a first conduction terminal, a second conduction terminal coupled to the complementary output node 152 and a control terminal configured to receive the inverted first signal (INN). The second transistor 158 has a first conduction terminal coupled to the second domain supply voltage node 130, a second conduction terminal coupled to the first conduction terminal of the first transistor 156 and a control terminal coupled to the complementary output node 152. In the second high-to-low current boosting stage 138, the first transistor 160 has a first conduction terminal, a second conduction terminal coupled to the output node 154 and a control terminal configured to receive the buffered first signal (INB). The second transistor 162 has a first conduction terminal coupled to the second domain supply voltage node 130, a second conduction terminal coupled to the first conduction terminal of the first transistor 160 and a control terminal coupled to the output node 154.

In the first low-to-high current boosting stage 140, the first transistor 164 has a first conduction terminal coupled to the complementary output node 152, a second conduction terminal and a control terminal configured to receive the buffered first signal (INB). The second transistor 166 has a first conduction terminal coupled to the second conduction terminal of the first transistor 164, a second conduction terminal coupled to the reference voltage node 120 and a control terminal coupled to the complementary output node 152. In the second low-to-high current boosting stage 142, the first transistor 168 has a first conduction terminal coupled to output node 154, a second conduction terminal and a control terminal configured to receive the inverted first signal (INN). The second transistor 170 has a first conduction terminal coupled to the second conduction terminal of the first transistor 168, a second conduction terminal coupled to the reference voltage node 120 and a control terminal coupled to the complementary output node 152.

During operation, the level shifting stage 134 receives the buffered first signal (INB) and the inverted first signal (INN), which have complementary states. The states have voltage levels set in accordance with the first range of operational voltages of the first voltage domain 102. If the buffered first signal (INB) is a logical one (e.g., asserted or activated), the buffered first signal (INB) has a first voltage level corresponding to the first supply voltage (Vdd1) and the inverted first signal (INN) has a second voltage level of 0V (e.g., deasserted or deactivated). By way of example, the buffered first signal (INB) may be 1.2V or 1.8V when asserted depending on the voltage domain.

When the buffered first signal (INB) is asserted, the first input transistor 148 becomes conductive pulling the complementary output node 152 down to the reference voltage (e.g., ground). The second cross-coupled transistor 146 is driven by the voltage of the complementary output node 152. The second cross-coupled transistor 146 becomes conductive thereby pulling the output node 154 up to the first supply voltage (Vdd1). Concurrently, the inverted first signal (INN) is deasserted and thereby the second input transistor 150 is non-conductive, which removes the output node 154 from the reference voltage. The output node 154 drives the first cross-coupled transistor 144. With the output node being pulled up to the first supply voltage (Vdd1), the first cross-coupled transistor 144 is non-conductive thereby removing the complementary output node 152 from the first supply voltage (Vdd1). Accordingly, assertion of the buffered first signal (INB) results in the output node 154 being pulled up to the first supply voltage (Vdd1) to reflect the buffered first signal (INB) and the complementary output node 152 being pulled down to the reference voltage to reflect the complementary state of the buffered first signal (INB).

Conversely, deassertion of the buffered first signal (INB) and assertion of the inverted first signal (INN) causes the second input transistor 150 to become conductive thereby pulling the output node 154 down to the reference voltage. The output node 154 drives the first cross-coupled transistor 144 thereby pulling the complementary output node 152 up to the first supply voltage (Vdd1). The first input transistor 148 is non-conductive thereby removing the complementary output node 152 from the reference voltage node 120. The second cross-coupled transistor 146 is driven by the voltage of the complementary output node 152 to be non-conductive and decouple the complementary output node 152 from the second domain supply voltage node 130.

When the first supply voltage (Vdd1) of the first voltage domain 102 is higher than the second supply voltage (Vdd2) of the second voltage domain 104, the first and second input transistors 148, 150 receive a higher voltage at their respective control terminals than their respective first conduction terminals. Accordingly, when driven by an asserted signal, the first and second input transistors 148, 150 are in a 'strongly on' state. The first and second cross-coupled transistors 144, 146, on the other hand, are driven by the output node 154 and the complementary output node 152, respectively. The voltages output node 154 and the complementary output node 152 are pulled up during operation to the second supply voltage (Vdd2). The first and second cross-coupled transistors 144, 146 receive second domain voltages at their respective terminals. Accordingly, the cross-coupled transistors 144, 146 do not operate in the 'strongly on' state.

When the input transistors 148, 150 and the cross-coupled transistors 144, 146 have the same size or area, the fact that the first supply voltage (Vdd1) is greater than the second supply voltage (Vdd2) results in an imbalance in the level shifting stage 134. The input transistors 148, 150 allow current to pass faster and at a greater rate than the cross-coupled transistors 144, 146.

The first high-to-low current boosting stage 136 provides a parallel current path for the first cross-coupled transistor 144 and mitigates the imbalance in the level shifting stage 134. The second high-to-low current boosting stage 138 provides a parallel current path for the second cross-coupled transistor 146 and mitigates the imbalance in the level shifting stage 134.

The first and second current boosting stages 136, 138 permit current flow during state transitions of the level shifting stage 134. A state transition may occur when the output nodes 152, 154 have not reached voltages dictated by the input signals (the buffered first signal (INB) and the inverted first signal (INN)) of the level shifting stage 134. The output nodes 152, 154 may retain voltages corresponding to prior input states.

The first current boosting stage 136 permits current flow when the inverted first signal (INN) is asserted (which upon completion of the level shifting stage 134 transition causes the complementary output node 152 to be pulled up to the second supply voltage (Vdd2)), but the complementary output node 152 is pulled down to the reference voltage. When the inverted first signal (INN) is asserted, the first transistor 156 is conductive. When the complementary output node 152 is pulled down to the reference voltage (rather than pulled up to the second supply voltage (Vdd2) to reflect the inverted first signal (INN)), the second transistor 158 becomes conductive. Consequently, the first current boosting stage 136 provides a current path that is parallel to the current path through the first cross-coupled transistor 144. The parallel path equalizes and make symmetric the current flowing into the complementary output node 152 with the current flowing out of the complementary output node 152 (via the current path of the first input transistor 148).

When inverted first signal (INN) is asserted but the complementary output node 152 is pulled down to the reference voltage and the first cross-coupled transistor 144 has not transitioned to the conductive state (as to cause the complementary output node 152 to be pulled up to the second supply voltage (Vdd2)), the first current boosting stage 136 permits current flow to the complementary output node 152 thereby expediting the pulling of the complementary output node 152 up to the second supply voltage (Vdd2). When the node 152 is pulled up to the second supply voltage (Vdd2) and the transition is complete, the second transistor 158 becomes non-conductive thereby ceasing power consumption.

The first current boosting stage 136 provides a current path when the first supply voltage (Vdd1) is greater than the second supply voltage (Vdd2). It is noted that the second high-to-low current boosting stage 138 and the first low-to-high current boosting stage 140 do not permit the passage of current when the first current boosting stage 136 permits passage. The second high-to-low current boosting stage 138 does not allow the passage of current because the buffered first signal (INB) is deasserted thereby making the first transistor of the stage 138 non-conductive. Similarly, the first low-to-high current boosting stage 140 is also driven by the complementary buffered first signal (INB) and is non-conductive. The second low-to-high current boosting stage 142 is active and sinks current through the transistors 168, 170. Activating the second low-to-high current boosting stage 142 supports the transition of the output node 154 to the deasserted state and the complementary output node 152 to the asserted state.

When the first supply voltage (Vdd1) is greater than the second supply voltage (Vdd2), the first transistor 156 is driven (at its control terminal) by a higher voltage (Vdd1) than the voltages provided to its terminals, which are according to the lower second supply voltage (Vdd2). Thus, the first transistor 156 becomes 'strongly on' when the inverted first signal (INN) is asserted. The second transistor 158 receives voltages of the second voltage domain 104 at its terminals. Accordingly, the first current boosting stage 136 provides current passage at the initiation of a state transition and when both the first supply voltage (Vdd1) is greater than the second supply voltage (Vdd2) and the inverted first signal (INN) is asserted.

The second high-to-low current boosting stage 138 provides current passage to support the second cross-coupled transistor 146. The second current boosting stage 138 permits current flow when the first supply voltage (Vdd1) is greater than the second supply voltage (Vdd2) and the buffered first signal (INB) is asserted, but a transition of the level shifting stage 134 has not been completed.

When the first supply voltage (Vdd1) is greater than the second supply voltage (Vdd2), the first transistor 160 is driven (at its control terminal) by a higher voltage (Vdd1) than the voltages provided to its terminals, which are according to the lower second supply voltage (Vdd2) of the second voltage domain 104. Thus, the first transistor 160 becomes 'strongly on' when the buffered first signal (INB) is asserted. The second transistor 162 receives voltages of the second voltage domain 104 at its terminals. Accordingly, the second current boosting stage 138 provides current passage at the initiation of a state transition and when both the first supply voltage (Vdd1) is greater than the second supply voltage (Vdd2) and the buffered first signal (INB) is asserted.

The current flow path balances the current flowing in and out of the output node 154. The current flow path aids in hastening the pulling of the output node 154 up to the second supply voltage (Vdd2) and both the rendering of the first cross-coupled transistor 144 non-conductive and the rendering of the second cross-coupled transistor 146 conductive. The second current boosting stage 138 operates to provide a current path during transitions of the buffered first signal (INB) from deasserted to asserted, whereas the first current boosting stage 136 operates during transitions of the buffered first signal (INB) from asserted to deasserted.

During the current boosting of the second current boosting stage 138, the first current boosting stage 136 and the second low-to-high current boosting stage 142 do not boost current. The first high-to-low current boosting stage 136 and the second low-to-high current boosting stage 142 do not permit current flow because the inverted first signal (INN) is deasserted. The first low-to-high current boosting stage 140 provides a current flow path. The first low-to-high current boosting stage 140 is active and sinks current through the transistors 164, 166. Activating the first low-to-high current boosting stage 140 supports the transition of the complementary output node 152 to the deasserted state and the output node 154 to the asserted state.

Whereas the first and second high-to-low current boosting stage 136, 138 provide a current path when the first supply voltage (Vdd1) is greater than the second supply voltage (Vdd2), the first and second low-to-high current boosting stage 140, 142 provide a current path when the second supply voltage (Vdd2) is greater than the first supply voltage (Vdd1). Thus, the level shifter may be used in the system 100 irrespective of the relationship between the first supply voltage (Vdd1) and the second supply voltage (Vdd2).

Three conditions are satisfied when the first low-to-high current boosting stage 140 passes current. The second supply voltage (Vdd2) is greater than the first supply voltage (Vdd1), the buffered first signal (INB) transitioned from deasserted to asserted and the complementary output node 152 is asserted (rather than deasserted) and is not reflective of the asserted state of the buffered first signal (INB). The first low-to-high current boosting stage 140 passes current to support the current passing through the first input transistor 148 and to equate the aggregate of the currents to the current passing through the first cross-coupled transistor 144.

The first low-to-high current boosting stage 140 passes current to the reference voltage node 120 thereby expediting the transition of the complementary output node 152 to zero voltage. This, in turn, expedites the transition of the second cross-coupled transistor 146 to the conductive state and the pulling up of the output node 154 to the second supply voltage (Vdd2). The voltage of the output node 154 drives the first cross-coupled transistor 144 and causes the first cross-coupled transistor 144 to become non-conductive thereby aiding in pulling the complementary output node 152 down to the reference voltage (deasserted state). At this point, the complementary output node 152 drives the second transistor 166 of the first low-to-high current boosting stage 140. The voltage of the complementary output node 152 causes the second transistor 166 to become non-conductive thereby ceasing current flow in the first low-to-high current boosting stage 140.

When the first low-to-high current boosting stage 140 permits current passage, the first high-to-low current boosting stage 136 and the second low-to-high current boosting stage 142 do not permit the passage of current as described herein. The second high-to-low current boosting stage 138 is active.

Similarly, three conditions are satisfied when the second low-to-high current boosting stage 142 passes current. The second supply voltage (Vdd2) is greater than the first supply voltage (Vdd1), the inverted first signal (INN) transitioned from deasserted to asserted and the output node 154 is asserted (rather than deasserted) and is not reflective of the asserted state of the inverted first signal (INN). The second low-to-high current boosting stage 142 passes current to support the current passing through the second input transistor 150 and to equate the aggregate of the currents to the current passing through the second cross-coupled transistor 146.

The second low-to-high current boosting stage 142 passes current to the reference voltage node 120 thereby expediting the transition of the output node 154 to zero voltage. This, in turn, expedites the transition of the first cross-coupled transistor 144 to the conductive state and the pulling up of the complementary output node 152 to the second supply voltage (Vdd2). The voltage of the complementary output node 152 drives the second cross-coupled transistor 146 and causes the second cross-coupled transistor 146 to become non-conductive thereby aiding in pulling the output node 154 down to the reference voltage (deasserted state). At this point, the output node 154 drives the second transistor 170 of the second low-to-high current boosting stage 142. The voltage of the output node 154 causes the second transistor 170 to become non-conductive thereby ceasing current flow in the second low-to-high current boosting stage 142. When the second low-to-high current boosting stage 142 permits current passage, the remaining stages second high-to-low current boosting stage 138 and the first low-to-high current boosting stage 140 do not permit the passage of current as described herein, whereas the first high-to-low current boosting stage 136 provides a supporting path.

Figure 4A:
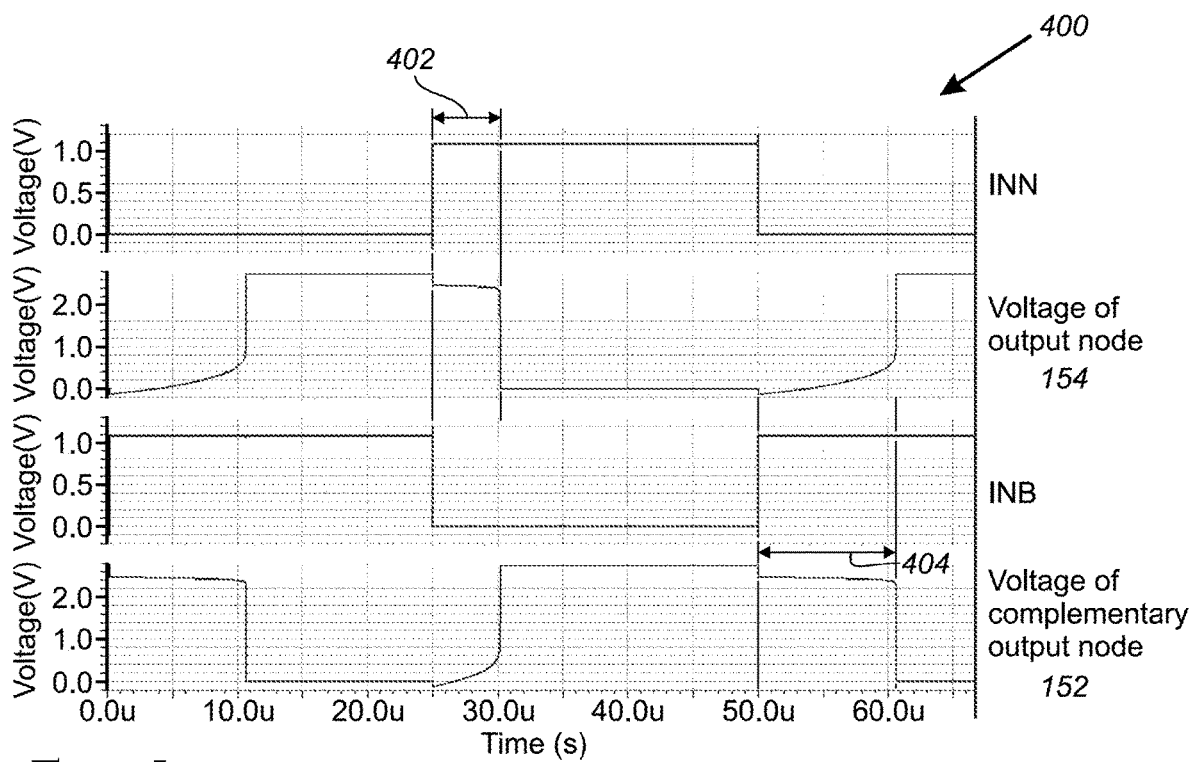
FIG. 4A shows diagrams of the voltages of an inverted first signal (INN), output node, buffered first signal (INB) and complementary output node in a conventional level shifter when the second supply voltage (Vdd2) is greater than the first supply voltage (Vdd1).

FIG. 4A shows diagrams 400 of the voltages of the inverted first signal (INN), output node 154, buffered first signal (INB) and complementary output node 152 in a conventional level shifter when the second supply voltage (Vdd2) is greater than the first supply voltage (Vdd1). As shown in the diagrams 400, the voltages of the output node 154 and the complementary output node 152 undergo delays in transitioning between states during time periods 402, 404.

Figure 4B:
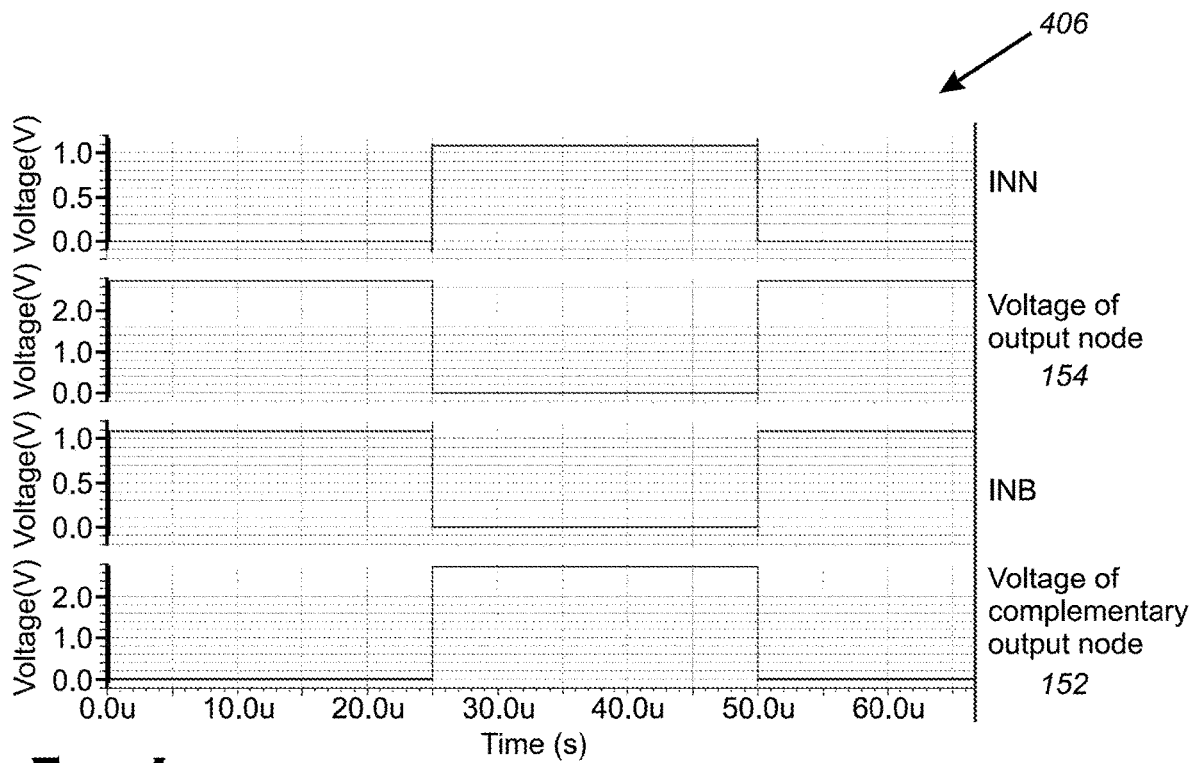
FIG. 4B shows diagrams of the voltages of the inverted first signal (INN), output node, buffered first signal (INB) and complementary output node in the level shifter when the second supply voltage (Vdd2) is greater than the first supply voltage (Vdd1).

FIG. 4B shows diagrams 406 of the voltages of the inverted first signal (INN), output node 154, buffered first signal (INB) and complementary output node 152 in the level shifter 106 when the second supply voltage (Vdd2) is greater than the first supply voltage (Vdd1). As shown in the diagrams 406, the switching of the voltages of the output node 154 and the complementary output node 152 is faster than the conventional level shifter and the delays of the time periods 402, 404 are mitigated.

Figure 5A:
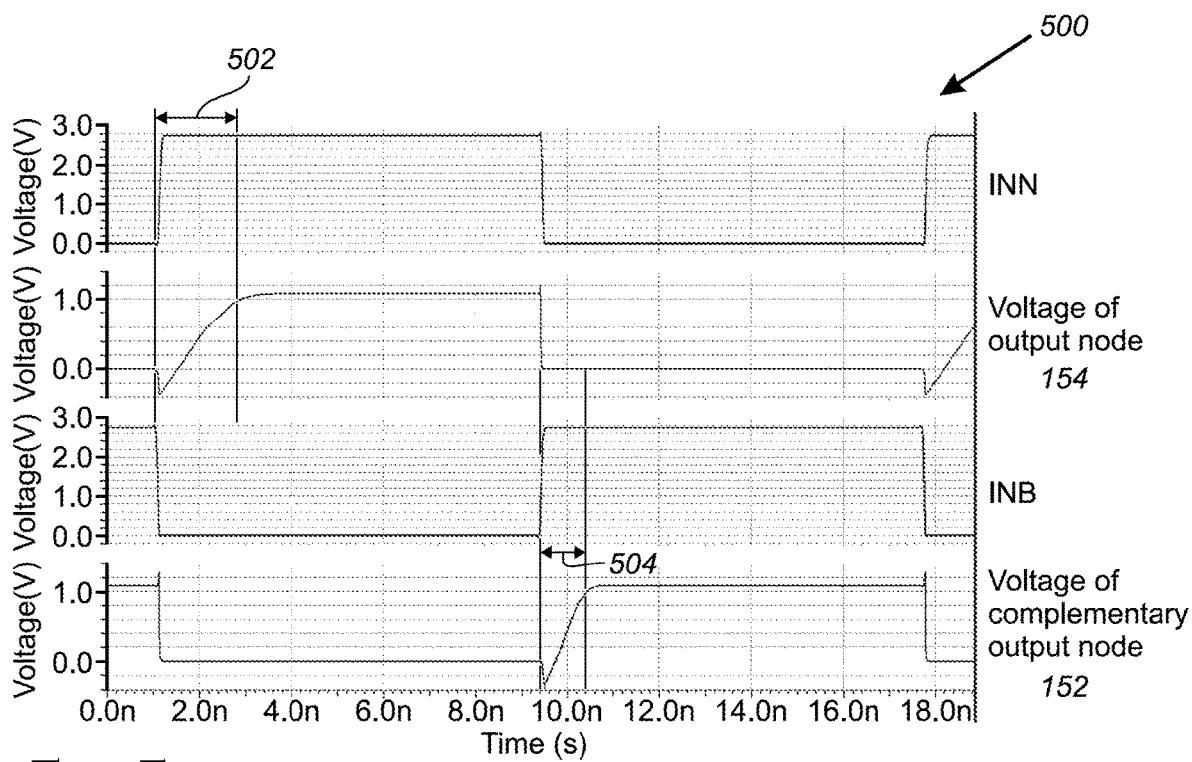
FIG. 5A shows diagrams of the voltages of the inverted first signal (INN), output node, buffered first signal (INB) and complementary output node in a conventional level shifter when the second supply voltage (Vdd2) is less than the first supply voltage (Vdd1).

FIG. 5A shows diagrams 500 of the voltages of the inverted first signal (INN), output node 154, buffered first signal (INB) and complementary output node 152 in a conventional level shifter when the second supply voltage (Vdd2) is less than the first supply voltage (Vdd1). As shown in the diagrams 500, the voltages of the output node 154 and the complementary output node 152 undergo delays in transitioning between states during time periods 502, 504. A delay occurs between the transitions of the inverted first signal (INN) and the buffered first signal (INB) and the transitions of the voltages of the output node 154 and the complementary output node 152.

Figure 5B:
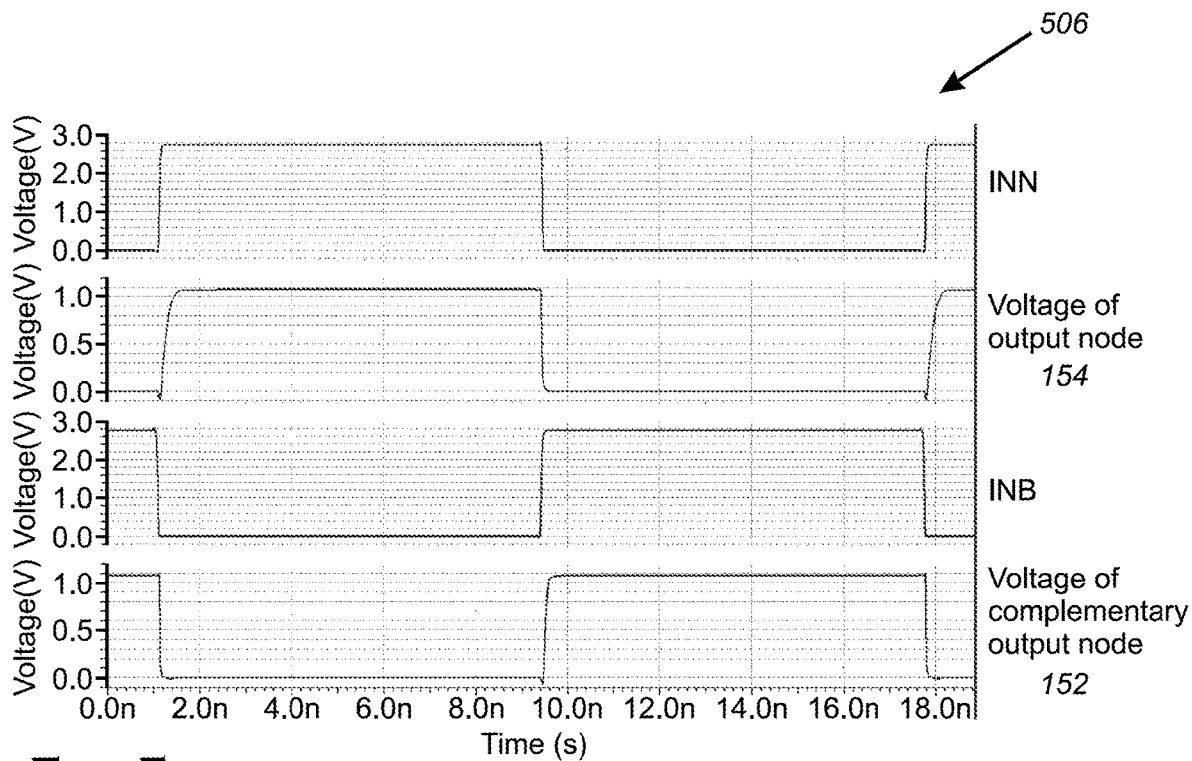
FIG. 5B shows diagrams of the voltages of the inverted first signal (INN), output node, buffered first signal (INB) and complementary output node in the level shifter when the second supply voltage (Vdd2) is less than the first supply voltage (Vdd1).

FIG. 5B shows diagrams 506 of the voltages of the inverted first signal (INN), output node 154, buffered first signal (INB) and complementary output node 152 in the level shifter 106 when the second supply voltage (Vdd2) is less than the first supply voltage (Vdd1). As shown in the diagrams 506, the switching of the voltages of the output node 154 and the complementary output node 152 is faster than the conventional level shifter and the delays of the time periods 502, 504 are mitigated.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A level shifter, comprising:
 a level shifting stage including:
  a plurality of transistors; and
  first and second nodes, wherein the level shifting stage is configured to transfer a first signal of a first voltage domain to a second signal of a second voltage domain; and
 a plurality of current boosting stages associated with the plurality of transistors, respectively, wherein a first current boosting stage of the plurality of current boosting stages includes:
  a first transistor driven by the first signal, the first transistor having a first conduction terminal, a control terminal configured to receive the first signal, and a second conduction terminal coupled to the first node; and
  a second transistor driven by a voltage of the first node, the second transistor having a first conduction terminal coupled to a voltage supply node of the second voltage domain, a control terminal coupled to the first node, and a second conduction terminal, the first conduction terminal of the first transistor being coupled to the second conduction terminal of the second transistor,
 wherein the first current boosting stage is configured to provide a first boosting stage current path to support a first level shifter current path of a first transistor of the plurality of transistors in response to:
  a first supply voltage of the first voltage domain being greater than a second supply voltage of the second voltage domain,
  the first signal having a first logical state, and
  the first node having a logical state reflecting that the first signal has a second logical state different from the first logical state.

2. The level shifter of claim 1, wherein the plurality of current boosting stages include a second current boosting stage configured to provide a second boosting stage current path to support a second level shifter current path of a second transistor of the plurality of transistors in response to:
 the first supply voltage of the first voltage domain being less than the second supply voltage of the second voltage domain,
 the first signal having the second logical state, and
 the first node having a logical state reflecting that the first signal has the first logical state.

3. The level shifter of claim 1, wherein the plurality of transistors include four transistors having the same size.

4. The level shifter of claim 1, wherein in response to the first current boosting stage providing the first boosting stage current path, two remaining current boosting stages of the plurality of current boosting stages do not provide respective boosting stage current paths.

5. The level shifter of claim 1, wherein each current boosting stage of the plurality of current boosting stages is selectively activated to provide a respective boosting stage current path based on whether the first supply voltage is greater than or less than the second supply voltage and whether the first signal has a deasserted state or an asserted state.

6. The level shifter of claim 1, wherein each of the plurality of current boosting stages includes at least two transistors.

7. The level shifter of claim 1, wherein the plurality of transistors of the level shifter are cross-coupled.

8. A system, comprising:
 a first circuit configured to output a first signal of a first voltage domain;
 a level shifter including:
  a level shifting stage including:
   a plurality of transistors; and
   first and second nodes, wherein the level shifting stage is configured to transfer the first signal of the first voltage domain to a second signal of a second voltage domain; and
  a plurality of current boosting stages associated with the plurality of transistors, respectively, wherein a first current boosting stage of the plurality of current boosting stages includes:
   a first transistor having a first conduction terminal, a control terminal configured to receive the first signal, and a second conduction terminal coupled to the first node; and
   a second transistor having a first conduction terminal coupled to a voltage supply node of the second voltage domain, a control terminal coupled to the first node, and a second conduction terminal, the first conduction terminal of the first transistor being coupled to the second conduction terminal of the second transistor,
  wherein the first current boosting stage is configured to provide a first boosting stage current path to support a first level shifter current path of a first transistor of the plurality of transistors in response to:
   a first supply voltage of the first voltage domain being greater than a second supply voltage of the second voltage domain,
   the first signal having a first logical state, and
   the first node having a logical state reflecting that the first signal has a second logical state different from the first logical state; and
 a second circuit configured to receive the second signal of the second voltage domain.

9. The system of claim 8, wherein the first transistor is driven by the first signal and the second transistor is driven by a voltage of the first node.

10. The system of claim 8, wherein the plurality of current boosting stages include a second current boosting stage configured to provide a second boosting stage current path to support a second level shifter current path of a second transistor of the plurality of transistors in response to:
the first supply voltage of the first voltage domain being less than the second supply voltage of the second voltage domain,
the first signal having the second logical state, and
the first node having a logical state reflecting that the first signal has the first logical state.

11. The system of claim 8, wherein the plurality of transistors include four transistors having the same size.

12. The system of claim 8, wherein in response to the first current boosting stage providing the first boosting stage current path, two remaining current boosting stages of the plurality of current boosting stages do not provide respective boosting stage current paths.

13. The system of claim 8, wherein each current boosting stage of the plurality of current boosting stages is selectively activated to provide a respective boosting stage current path based on whether the first supply voltage is greater than or less than the second supply voltage and whether the first signal has a deasserted state or an asserted state.

14. A method, comprising:
receiving, by a level shifter, a first signal of a first voltage domain;
transferring, by the level shifter, the first signal of the first voltage domain to a second signal of a second voltage domain by at least:
determining that a first supply voltage of the first voltage domain is greater than a second supply voltage of the second voltage domain;
determining that the first signal has a first logical state;
determining that a first node of the level shifter having a logical state reflecting that the first signal has a second logical state different from the first logical state;
providing, by a first current boosting stage of a plurality of current boosting stages of the level shifter, a first boosting stage current path to support a first level shifter current path of a first transistor of a plurality of transistors of the level shifter;
outputting, by the level shifter, the second signal of the second voltage domain;
driving a first transistor of the first current boosting stage, the first transistor having a first conduction terminal, a control terminal configured to receive the first signal, and a second conduction terminal coupled to the first node; and
driving a second transistor of the first current boosting stage, the second transistor having a first conduction terminal coupled to a voltage supply node of the second voltage domain, a control terminal coupled to the first node, and a second conduction terminal, the first conduction terminal of the first transistor being coupled to the second conduction terminal of the second transistor.

15. The method of claim 14, wherein:
the first transistor of the first current boosting stage is driven by the first signal; and
the second transistor of the first current boosting stage is driven by a voltage of the first node.

16. The method of claim 14, comprising:
determining that the first supply voltage of the first voltage domain is less than the second supply voltage of the second voltage domain;
determining that the first signal has the second logical state;
determining that the first node has a logical state reflecting that the first signal has the first logical state; and
providing, by a second current boosting stage of the plurality of current boosting stages, a second boosting stage current path to support a second level shifter current path of a second transistor of the plurality of transistors.

17. The method of claim 14, wherein the plurality of transistors include four transistors having the same size.

18. The method of claim 14, comprising:
In response to the first current boosting stage providing the first boosting stage current path, causing two remaining current boosting stages of the plurality of current boosting stages to refrain from providing respective boosting stage current paths.

19. The method of claim 14, wherein each of the plurality of current boosting stages includes at least two transistors.

20. The method of claim 14, wherein the plurality of transistors of the level shifter are cross-coupled.

* * * * *